United States Patent [19]

Yamauchi et al.

[11] Patent Number: 4,615,252

[45] Date of Patent: Oct. 7, 1986

[54] TOUCH CONTROL APPARATUS FOR ELECTRONIC KEYBOARD INSTRUMENT

[75] Inventors: Takao Yamauchi; Yasuhiko Asahi, both of Hamamatsu, Japan

[73] Assignee: Nippon Gakki Seizo Kabushiki Kaisha, Hamamatsu, Japan

[21] Appl. No.: 695,098

[22] Filed: Jan. 25, 1985

[30] Foreign Application Priority Data

Feb. 1, 1984 [JP] Japan ............................ 59-11642[U]

[51] Int. Cl.[4] ........................ G10H 1/34; H01L 41/08; H01C 10/10

[52] U.S. Cl. .................................. 84/1.1; 84/DIG. 7; 84/DIG. 24; 340/365 A; 338/69; 338/99; 338/114; 310/338

[58] Field of Search ........... 84/1.1, DIG. 7, DIG. 24; 340/365 A; 310/338, 340, 348; 338/69, 99, 114

[56] References Cited

U.S. PATENT DOCUMENTS

| | | | |
|---|---|---|---|
| 4,027,569 | 6/1977 | Luce et al. | 84/DIG. 7 X |
| 4,314,228 | 2/1982 | Eventoff | 338/99 X |
| 4,378,721 | 4/1983 | Kaneko et al. | 84/DIG. 24 X |
| 4,499,394 | 2/1985 | Koal | 310/338 X |

OTHER PUBLICATIONS

Japanese Utility Model Laid Open Specification No. Sho50-121726.

Japanese Utility Model Laid Open Specification No. Sho59-9399.

*Primary Examiner*—William B. Perkey

*Attorney, Agent, or Firm*—Blakely, Sokoloff, Taylor & Zafman

[57] ABSTRACT

A touch control apparatus for an electronic keyboard instrument, comprises a sensor having: an elongated insulating sheet having a set of conductive pattern films on a surface thereof, the elongated insulating sheet being folded and the set of conductive pattern films being formed to be spaced apart from each other; and a pressure-sensitive element sandwiched in a space defined by the folded elongated insulating sheet to be in contact with the conductive pattern films. The pressure sensitive element is deformed when a key of the instrument is depressed to deliver an electrical output through the conductive films representing the magnitude of the key depression. The apparatus is superior in easiness of handling the sensor and of assembling the apparatus.

22 Claims, 10 Drawing Figures

TOUCH CONTROL APPARATUS FOR ELECTRONIC KEYBOARD INSTRUMENT

BACKGROUND OF THE INVENTION

The present invention relates to a touch control apparatus for an electronic keyboard instrument.

It is known that, in an electronic musical instrument, a touch responsive control is carried out to control tonal characteristics according to key depression touch. The touch responsive control is generally classified into an initial-touch control wherein intensity of key depression in the course of depression or just upon the key depression is sensed to control a tone, and the after-touch control wherein intensity of key depression when or after a key has been fully depressed is sensed to control a tone. The initial touch control is usually utilized to make a tone loud when a key is depressed intensively while the after-touch control usually makes for a tremolo effect, vibrato effect and tremolo speed control, etc.

In order to achieve such special sound effects, a conventional touch control apparatus is provided where some control switches, such as a tremolo switch, are provided so as to obtain a desired sound. In another conventional touch control apparatus, depressions of the keys are utilized to obtain the special sound effects. Such touch control apparatus utilizing keys is known as a key depression pressure detection apparatus for an electronic musical instrument as disclosed in Japanese Utility Model Preliminary Publication No. 50-121726. This detection apparatus comprises a horizontal electrode substrate, a horizontal elastic conductor opposing the electrode substrate, a pair of elastic insulators inserted therebetween along long sides of the electrode substrate and the elastic conductor, and a flexible electrode plate conductively fixed on the upper surface of the elastic conductor along its long side. When a key is depressed, the elastic conductor is deflected downward to change a contact area and a contact pressure with the electrode substrate in accordance with a magnitude of the depression force, thereby performing the after-touch control operation.

There is a problem with the manufacture and assembly of such a conventional key depression pressure detection apparatus. Since a pair of elastic insulators is required, the number of components is increased, resulting in cumbersome manufacture and assembly. In addition, if the elastic insulators are not mounted exactly parallel to each other, the degree of deflection differs along the longitudinal direction. As a result, a resistance changes, and the quality of the apparatus is degraded.

In order to solve the above problem, another conventional touch control apparatus (Japanese Utility Model Preliminary Publication No. 59-9399 of the same applicant) is proposed wherein a sensor and a damping member are stacked in a case, and the sensor is made of an elastic resistor and a pair of conductive plates mounted on the upper and lower surfaces of the resistor.

However, according to this touch control apparatus, an extra case must be used to align the stacked members and electrically insulate the stacked members from other members.

SUMMARY OF THE INVENTION

It is, therefore, an object of the present invention to provide a touch control apparatus for an electronic keyboard instrument which has a simpler construction than that of the conventional touch control apparatus.

It is another object of the present invention to provide a touch control apparatus for an electronic keyboard instrument, wherein fewer components are required and the assembly operation can be simplified, thus improving productivity.

It is still another object of the present invention to provide a touch control apparatus for an electronic keyboard instrument, wherein an inexpensive material is used, thereby lowering the cost of manufacture.

In order to achieve the above objects of the present invention, at least one set of conductive pattern films or layers is formed on one major surface of an elongated insulating sheet. The sheet is folded lengthwise to form a space along a longitudinal direction thereof. A pressure-sensitive element is placed in the space defined by the inner surface of the sheet, thereby constituting a sandwiched sensor. The sensor is disposed between the aligned keys and a base. When a key is depressed, electrical characteristics of the pressure-sensitive element change in accordance with a change in magnitude of the depression force acting on the pressure-sensitive element. Therefore, a change in an electrical signal can be extracted from the conductive pattern film.

According to an aspect of the present invention, therefore, there is provided a touch control apparatus for an electronic keyboard instrument, comprising a sensor having: an elongated insulating sheet having at least one set of conductive pattern films on a surface thereof, the elongated insulating sheet being folded and the set of first and second conductive pattern films being formed to be spaced apart from each other; a pressure-sensitive element sandwiched in a space defined by the folded elongated insulating sheet so as to be in contact with the conductive pattern films, the pressure-sensitive element being operated such that electrical characteristics thereof change according to a pressure applied thereto to generate an output, the output being extracted by the set of conductive pattern films; and means for regulating a position of the pressure-sensitive element sandwiched by the elongated insulating sheet with respect to the elongated insulating sheet, wherein the sensor is arranged at a position that the sensor is applied with a pressure in accordance with a depression of a key of the instrument.

DESCRIPTION OF THE PREFERRED EMBODIMENT

Figure 1:
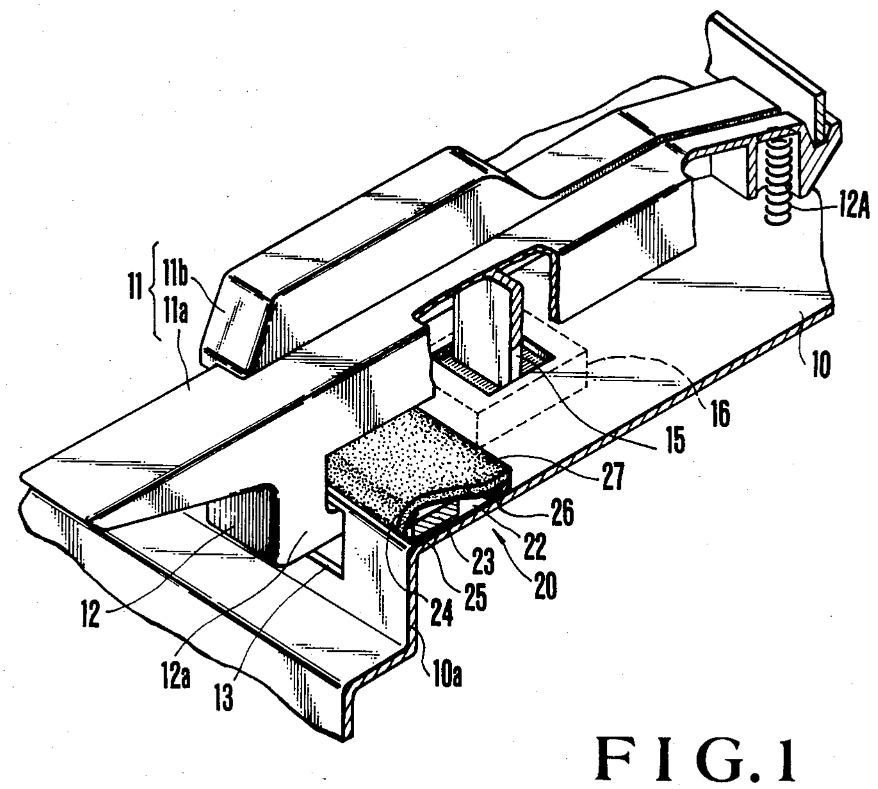
FIG. 1 is a perspective view showing the main part of a touch control apparatus for an electronic keyboard instrument according to an embodiment of the present invention.

FIG. 1 shows a touch control apparatus for an electronic keyboard instrument according to an embodiment of the present invention. Referring to FIG. 1, reference numeral 10 denotes a keyboard frame mounted substantially horizontally on the upper surface of a shelf board of the keyboard instrument. Rear end portions of keys 11 comprising a plurality of natural keys 11*a* and flat keys 11*b* are vertically pivotally supported on the keyboard frame 10. A stopper 12 integrally extends downward from the lower surface of the front end of each of the keys 11. A lower end bent portion 12*a* is vertically movably engaged with a through hole 13 formed in a vertical wall 10*a* of the keyboard frame 10. Each of the keys 11 is biased upward by a return spring 12A arranged between a portion near the rear end of the key and the keyboard frame 10. The bent portion 12*a* abuts against the upper edge defining the through hole 13 and each key is held substantially horizontally. When a key is depressed, its rear end portion is pivoted about a pivot shaft, and its front end is pivoted downward. Then, a corresponding actuator 15 actuates a key switch 16 arranged on the lower surface of the keyboard frame 10. A corresponding tone signal is electrically generated and is produced as a tone by a musical tone generator not shown. When the key 11 is depressed with a standard depression force, the lower surface of the key abuts against the upper surface of a touch control apparatus 20, which stops the downward movement of the key. However, when the key is depressed with a force exceeding the standard force, the touch control apparatus 20 is actuated to provide the after-touch control and/or the initial touch control as desired.

Figure 2:
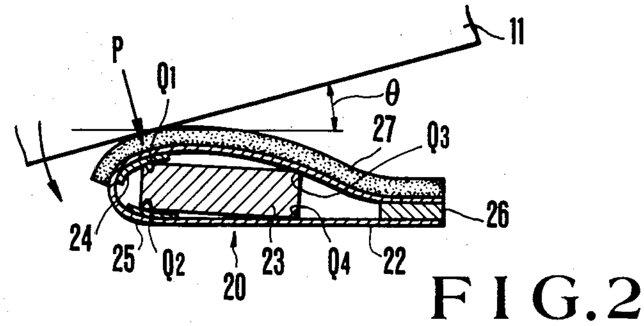
FIG. 2 is a sectional view of the main part of the touch control apparatus shown in FIG. 1.
Figure 3:
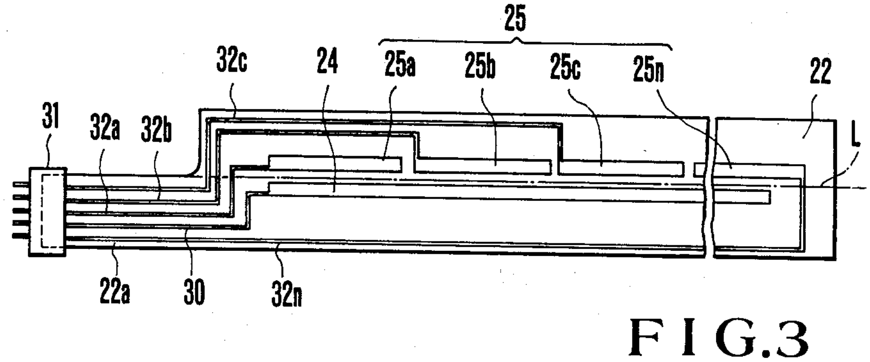
FIG. 3 is a developed view of an insulating sheet of the touch control apparatus of FIG. 1.

As shown in FIGS. 2 and 3, the touch control apparatus 20 comprises mainly an insulating sheet 22, a pressure-sensitive elastic conductor 23, first and second conductive pattern films 24 and 25, an insulating adhesive layer 26, and a damping member 27. The touch control apparatus 20 extends along the upper surface of the front portion of the keyboard frame 10 and is common with respect to the keys 11 of an appropriate number.

The insulating sheet 22 comprises a sheet made of a thin polyester film. The insulating sheet 22 has a length corresponding to that of the keyboard constituted by the respective keys 11. The insulating sheet 22 is folded at a central line L along the longitudinal direction such that the upper surface of the sheet 22 becomes the inner surface which surrounds the pressure-sensitive elastic conductor 23, as shown in FIG. 2. The first and second conductive pattern films 24 and 25 are formed on the inner surface of the sheet 22 so as to contact the elastic conductor 23. The overlapping end portions along the direction of width of the sheet 22 are integrally bonded by the insulating adhesive layer 26 which provides a mechanical seal as well as electrical insulation. The edge portions along the longitudinal direction of the sheet 22 are also sealed by corresponding adhesive layers or the like. The layer 26 can comprise an adhesive, a spacer having two surfaces with an adhesive, or a two-sided adhesive tape. The damping member 27 made of for example felt is adhered to the entire upper portion of the outer surface of the folded insulating sheet 22. An extended portion 22*a* is integrally formed with one end of the insulating sheet 22 along the longitudinal direction and has a width half that of the insulating sheet 22. A connector 31 is coupled to the distal end of the extended portion 22*a*.

Figure 4:
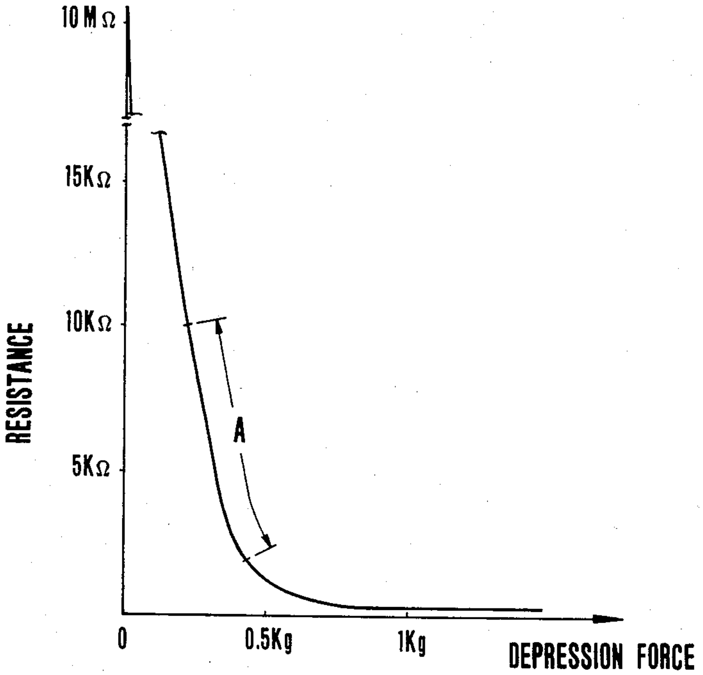
FIG. 4 is a graph for explaining changes in resistance as a function of magnitude of a depression force.

The elastic conductor 23 comprises an elastic material (e.g., pressure-sensitive electrically conductive rubber) or an electrostrictive element (a pressure-sensitive element) made of barium titanate, piezoelectric plastic or the like. The elastic conductor 23 is provided for each of the keys 11. However, a common elastic conductor may be used for a plurality of keys or all keys. For illustrative convenience, the thickness of the elastic conductor 23 is relatively large in FIGS. 1 and 2. However, in practice, the elastic conductor 23 preferably has a thickness of about 0.5 mm. As described above, various materials may be used for the elastic conductor 23. An example of the resistance-force characteristics of the elastic conductor 23 made of piezo plastics is illustrated in FIG. 4. Electrical resistance of piezo plastics changes within a range A according to a depression applied thereto and is in the range of 1 MΩ to 10 MΩ when the key is not depressed, so as to provide touch control.

The first and second conductive pattern films 24 and 25 are formed equidistantly from the central line L of the sheet 22 along the direction of length of the sheet 22. The first and second conductive pattern films 24 and 25 vertically oppose each other while sandwiching the elastic conductor 23 therebetween, thereby constituting electrodes. The first and second conductive pattern films 24 and 25 may be formed by screen printing, coating, deposition or sputtering. As shown in FIG. 3, the first conductive pattern film 24 is formed substantially along the entire length of the insulating sheet 22 and is thus common to all the keys 11 of the keyboard. Therefore, the first conductive pattern film 24 constitutes a common electrode. An end of the first conductive pattern film 24 is connected to one end of a thin lead 30 the other end of which is connected to the connector 31.

The second conductive pattern film 25 is spaced by a predetermined distance from the first conductive pattern film 24 and is parallel thereto. The second conductive pattern film 25 comprises a number of film portions 25*a*, 25*b*, 25*c*, . . . , and 25*n* which correspond to the respective keys 11. The film portions 25*a*, 25*b*, . . . , and 25*n* are respectively connected to the connector 31 through leads 32*a*, 32*b*, 32*c*, . . . , and 32*n*. The leads 32*a*, 32*b*, . . . , and 32*n* are respectively formed integrally with the second conductive pattern film 25 in the same manner as the lead 30. However, the leads 30, 32*a*, 32*b*, 32*c*, . . . , and 32*n* need not be formed integrally with the first and second conductive pattern films 24 and 25, respectively. A thin lead wire may be bonded to the inner surface of the insulating sheet 22 to constitute the leads 30, 30*a*, 30*b*, . . . , and 30*n*. The first and second conductive pattern films 24 and 25 are formed at positions sufficiently away from the adhesive layer 26 so as to be unaffected by pressure acting on the elastic conductor 23 when the insulating sheet 22 is folded and is adhered at its end portions by the adhesive layer 26. The first and second conductive pattern films 24 and 25 are preferably adhered in the vicinity of the folded portion of the sheet 22. When the first and second conductive pattern films 24 and 25 are formed in the vicinity of the folded portion of the sheet 22 and are respectively brought into contact with front edges Q1 and Q2 of the elastic conductor 23, as shown in FIG. 2, the keys 11 of the keyboard strike the elastic conductor 23 obliquely (at a predetermined angle $\theta$) through the damping member 27 and the insulating sheet 22. Therefore, proper operation of the touch control apparatus 20 can be performed.

When the player depresses a given key with a force greater than the usual standard force, the lower surface of the key abuts against the damping member 27. The portion of the damping member 27 which is struck by the lower surface of the key is deformed in accordance with a magnitude of the depression force, thereby changing a contact pressure between the elastic member 23 and the first and second conductive pattern films 24 and 25. An electrical resistance of the elastic conductor 23 along the direction of thickness changes. This change is detected by the first and second conductive pattern films 24 and 25, and the electrical signal is supplied to a tone generation control circuit through the connector 31. Then, the tone signal generated by the tone generator can be controlled to provide a change in volume, tone color and/or other tonal characteristics. As described above, the key abuts against the damping member 27 at a given angle $\theta$ (FIG. 2). In this case, a pressure P is applied mainly to the edges Q1 and Q2 of the elastic conductor 23. When the first and second conductive pattern films 24 and 25 are formed in the vicinity of the edges Q1 and Q2, the change in resistance of the elastic conductor 23 can be accurately detected. Pressure may be caused by the adhesive layer 26 on rear edges Q3 and Q4 of the elastic conductor 23. However, since the first and second conductive pattern films 24 and 25 are formed only in the vicinity of the edges Q1 and Q2, this pressure has no effect.

According to the touch control apparatus 20 of this embodiment, the pair of electrodes (i.e., the first and second conductive pattern films 24 and 25) are formed on the insulating sheet 22. The insulating sheet 22 is folded to surround the elastic conductor 23. The resultant apparatus has a simple construction, and high precision alignment is not required, thereby simplifying manufacture and assembly. In addition, since the sheet 22 is relatively low in cost, the manufacturing cost can be further decreased. In addition to these advantages, since the insulating sheet 22 is folded to provide elasticity (a cushioning property), the touch of the keys is improved.

The present invention is not limited to the above embodiment, but can be extended to various modifications.

In the above embodiment, the folded insulating sheet 22 is fixed directly on the upper surface of the keyboard frame 10. However, the insulating sheet 22 may be mounted on the keyboard frame 10 by a board made of a synthetic resin or aluminum.

In the above embodiment, the second conductive pattern film 25 is divided into a plurality of sections corresponding to the respective keys. However, the second conductive pattern film 25 may be divided so as to correspond to a plurality of keys (e.g., soprano and bass sections). In a single keyboard instrument, the second conductive pattern film 25 may be divided into a melody key section and an accompanyment key section. Furthermore, a plurality of units each comprising a set of second conductive pattern films and the first common conductive pattern film can be used in one keyboard.

Figure 5:
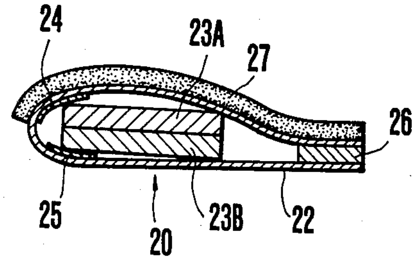
FIGS. 5 to 10 are schematic views showing modifications of the touch control apparatus of FIG. 1.

In the above embodiment, the single elastic conductor 23 is arranged between the first and second conductive pattern films 24 and 25. However, as shown in FIG. 5, a plurality of (two in this modification) elastic conductors 23A and 23B having different characteristics may be stacked, and the resultant laminate may be used in place of the single elastic conductor 23. In this case, combined characteristics of these elastic conductors 23A and 23B are used to obtain a touch control effect.

Figure 6:
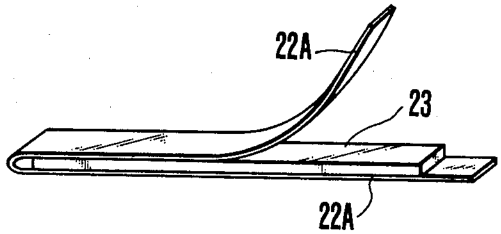

In the above embodiments, the two ends of the insulating sheet 22 are folded together lengthwise, as shown in FIG. 2. However, as shown in FIG. 6, an insulating sheet 22A twice as long as the length of the touch response apparatus can be used. The elastic conductor 23 is placed on a first portion of the sheet 22A, and a second portion thereof is folded over the elastic conductor 23. In this case, one of the combined conductive pattern films may be formed on the first half of the sheet 22A, and the other may be formed on the second half of the sheet 22A. Furthermore, a wiring layer may extend from one end of the first half of the sheet 22A to the opposing end of the second half of the sheet 22A.

Figure 7:
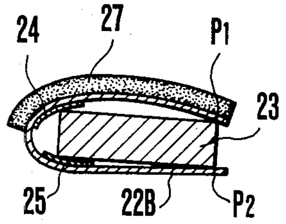

In the embodiment described with reference to FIGS. 1 to 3, the two ends of the sheet 22 folded lengthwise are adhered by the adhesive layer 26. However, as shown in FIG. 7, two ends of a sheet 22B may be respectively adhered to shoulders P1 and P2 of the elastic conductor 23.

Figure 8:
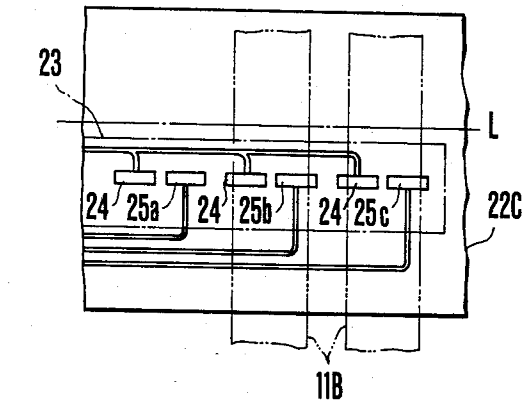

Furthermore, in the above embodiments, the pair of conductive pattern films is arranged to sandwich the elastic conductor. However, as shown in FIG. 8, conductive pattern films 24, 25*a*, 24, 25*b*, . . . may be alternately spaced apart from each other along one line on one half of the surface of an insulating sheet 22C with respect to the central longitudinal line L. In this case, by utilizing the change in the resistance-force characteristics along the length of the elastic conductor 23 upon depression of the key, touch control can be performed. The conductive pattern film need not be formed on the second half of the surface of the insulating sheet. This second half of the sheet is preferably folded along the line L to cover the conductive films 24 and 25. It should be noted that a portion represented by an imaginary line 11B is a key position.

Figure 9:
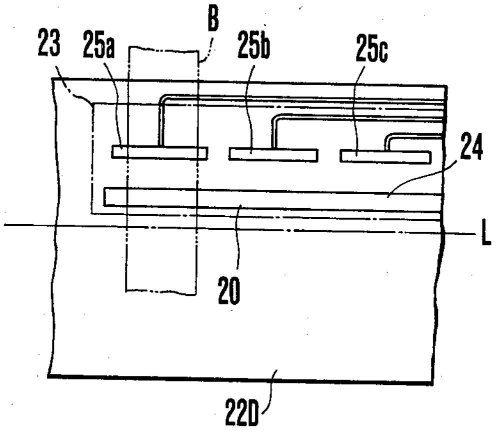

As shown in FIG. 9 in the same manner as in FIG. 8, conductive pattern films 24 and 25 may be formed on one half of the surface with respect to the central line L of an insulating sheet 22D. In this case, a common conductive pattern film 24 is arranged for all keys along the longitudinal direction of a sheet 22D, and the conductive pattern films 25*a*, 25*b*, . . . are formed on the same surface portion as the common conductive pattern film 24 and are spaced from each other along the conductive film 24.

Figure 10:
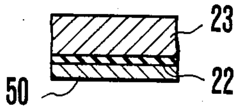

As shown in FIG. 10, a reinforcing plate 50 (e.g., an aluminum plate) may be adhered on the lower surface of an insulating sheet 22 through a two-sided tape or another proper adhesive. In this case, further adhesive may be applied to the lower surface of the reinforcing plate and to be covered with a tape. The tape is removed when assembled in a keyboard, thereby simplifying the assembly operation.

Furthermore, when the elastic conductor may be fixed on the insulating sheet through an adhesive to simplify the assembly operation.

As seen from the description of the embodiments, the touch control apparatus according to the invention is particularly suited for the after-touch control. However, it is also possible to use this apparatus to provide the initial-touch control.

What is claimed is:

1. A touch control apparatus for an electronic keyboard instrument, comprising a sensor having: an elongated insulating sheet having at least one set of first and second conductive pattern films on a surface thereof, said elongated insulating sheet being folded and said set of first and second conductive pattern films being formed to be spaced apart from each other; a pressure-sensitive element sandwiched in a space defined by said folded elongated insulating sheet so as to be in contact with said conductive pattern films, said pressure-sensitive element being operated such that electrical characteristics thereof change according to a pressure applied thereto to generate an output, the output being extracted by said set of conductive pattern films; and means for regulating a position of said pressure-sensitive element sandwiched by said elongated insulating sheet with respect to said elongated insulating sheet, wherein said sensor is arranged at a position that the sensor is applied with a pressure in accordance with a depression of a key of the instrument.

2. An apparatus according to claim 1, wherein said elongated insulating sheet is folded along a longitudinal axis thereof.

3. An apparatus according to claim 2, wherein said first and second pattern films are formed to oppose opposite surfaces of said pressure-sensitive element when said elongated sheet is folded.

4. An apparatus according to claim 1, wherein said elongated insulating sheet is folded widthwise.

5. An apparatus according to claim 1, wherein said first conductive pattern film is common to plural keys, and said second conductive pattern film corresponds to a single key.

6. An apparatus according to claim 1, wherein said elongated insulating sheet is folded lengthwise, and said set of conductive pattern films are arranged so as to contact edge portions of said pressure-sensitive element which are situated in the vicinity of a folded portion of the sheet.

7. An apparatus according to claim 1, wherein two end portions of said elongated insulating sheet folded lengthwise are bonded through an insulating layer.

8. An apparatus according to claim 1, wherein said pressure-sensitive element is connected to said elongated insulating sheet through an adhesive.

9. An apparatus according to claim 1, wherein two ends of said elongated insulating sheet folded lengthwise are bonded to end portions of said pressure-sensitive element which are apart from a folded portion of said elongated insulating sheet.

10. An apparatus according to claim 1, wherein a plurality of sets of said first and second conductive pattern films are provided, each set being constituted by at least one of said first conductive pattern films and a plurality of said second conductive pattern films.

11. An apparatus according to claim 1, wherein said pressure-sensitive element has a rectangular sectional shape.

12. An apparatus according to claim 11, wherein said first and second conductive pattern films are arranged at corners of said pressure-sensitive element.

13. An apparatus according to claim 1, wherein said pressure-sensitive element comprises a laminate of elements having different characteristics.

14. An apparatus according to claim 1, wherein a lower portion of an outer surface of said elongated insulating sheet is fixed on a reinforcing plate.

15. An apparatus according to claim 1, wherein an upper portion of an outer surface of said elongated insulating sheet has a damping member against which the key abuts when depressed.

16. An apparatus according to claim 1, wherein said first and second conductive pattern films are formed to oppose a same surface of said pressure-sensitive element.

17. An apparatus according to claim 16, wherein parts of said first and second conductive pattern films are formed in one line along a longitudinal direction of said elongated insulating sheet and are apart by a predetermined distance from each other.

18. An apparatus according to claim 16, wherein parts of said first and second conductive pattern films are formed in one line along a longitudinal direction of said elongated insulating sheet and are apart by a predetermined distance from a central line extending along the longitudinal direction of said elongated insulating sheet.

19. A touch control apparatus for an electronic keyboard instrument, comprising: an elongated insulating sheet folded to have a certain length within a length of a keyboard; pressure-sensitive means sandwiched by said folded insulating sheet and corresponding to one or a plurality of keys; first and second conductive pattern films formed on an inner surface of said elongated insulating sheet to sandwich said pressure-sensitive means; and an adhesion portion for adhering two ends of said elongated insulating sheet, wherein electrical resistance of said pressure-sensitive means between said first and second conductive pattern films changes in accordance with a magnitude of a depression force when a key is depressed to press said pressure-sensitive means through said elongated insulating sheet.

20. An apparatus according to claim 19, wherein said pressure-sensitive means comprises an electrically conductive rubber.

21. An apparatus according to claim 20, wherein a lower portion of an outer surface of said elongated insulating sheet is fixed on a reinforcing plate.

22. An apparatus according to claim 19, wherein said elongated insulating sheet is folded lengthwise.

* * * * *